United States Patent [19]
Yamada et al.

[11] Patent Number: 5,483,482
[45] Date of Patent: Jan. 9, 1996

[54] SEMICONDUCTOR MEMORY DEVICE HAVING BIDIRECTIONAL POTENTIAL BARRIER SWITCHING ELEMENT

[75] Inventors: Takashi Yamada; Yohji Watanabe, both of Kawasaki, Japan

[73] Assignee: Kabushiki Kaisha Toshiba, Kawasaki, Japan

[21] Appl. No.: 854,816

[22] Filed: Mar. 17, 1992

[30] Foreign Application Priority Data

Mar. 18, 1991 [JP] Japan ................................. 3-052729
Jul. 3, 1991 [JP] Japan ................................. 3-163130

[51] Int. Cl.$^6$ ................................. G11C 11/36
[52] U.S. Cl. .................... 365/175; 365/149; 365/203; 257/906
[58] Field of Search ................. 365/149, 175, 365/203, 189.09, 189.11; 257/906, 497, 498

[56] References Cited

U.S. PATENT DOCUMENTS

| | | | |
|---|---|---|---|
| 3,196,405 | 7/1965 | Gunn | 365/149 |
| 3,676,715 | 7/1972 | Brojdo | 307/304 |
| 4,449,140 | 5/1984 | Board | 257/497 |
| 4,920,513 | 4/1990 | Takeshita et al. | 365/175 |
| 5,267,193 | 11/1993 | Lin | 365/168 |

FOREIGN PATENT DOCUMENTS

| | | |
|---|---|---|
| 2743948 | 4/1979 | Germany . |
| 2855079 | 7/1980 | Germany . |

OTHER PUBLICATIONS

E. S. Schlig, "Two–Diode Charge Storage Monolithic Memory Cell", IBM TDB, vol. 16, No. 5, Oct. 1973, pp. 1448.

Malaviya et al., "Pipe–Insensitive Dynamic Bipolar RAM For Polyimide–Filled Trench", IBM TDB, vol. 27, No. 7B, Dec. 1984, pp. 4524–4528.

"Three–Terminal CID as Random Access Memory Cell", R. Koch et al., IEEE Journal of Solid–State Circuits, vol. SC–12, No. 5, Oct. 1977, pp. 534–536.

"The 3T–CID Cell, a Memory Cell for High–Density Dynamic RAM's", G. Grassl et al., IEEE Transactions on Electron Devices, vol. ED–26, No. 6, Jun. 1979, pp. 865–870.

"A Survey of High–Density Dynamic RAM Cell Concepts", P. Chatterjee et al., IEEE Transactions on Electron Devices, vol. ED–26, No. 6, Jun. 1979, pp. 827–839.

"A Vertically Integrated Dynamic Ram–Cell: Buried Bit Line Memory Cell With Floating Transfer Layer", T. Mouthaan et al., Solid–State Electronics, vol. 29, No. 12, 1986, pp. 1289–1294.

*Primary Examiner*—David C. Nelms
*Assistant Examiner*—Andrew Q. Tran
*Attorney, Agent, or Firm*—Finnegan, Henderson, Farabow, Garrett & Dunner

[57] ABSTRACT

A semiconductor memory device comprises a plurality of memory cells each including an element with a potential barrier serving as a switching element and a capacitor one terminal of which is connected to the switching element. The memory cells are disposed in a matrix arrangement. Terminals of the respective capacitors which are not connected to the switching elements are connected to each other in intersection with bit lines in the memory cell arrangement to thereby form word lines. Alternatively, the terminals of the respective capacitors connected to the switching elements may be connected to each other in intersection with the bit lines to thereby form word lines.

9 Claims, 16 Drawing Sheets

"0" READING,
"0" REWRITING CYCLE

"1" READING,
"1" REWRITING CYCLE

SEMICONDUCTOR MEMORY DEVICE HAVING BIDIRECTIONAL POTENTIAL BARRIER SWITCHING ELEMENT

BACKGROUND OF THE INVENTION

1. Field of the Invention

The present invention relates to a semiconductor memory device and more particularly to a semiconductor memory device in which memory cells are made up of a 2-terminal potential barrier and a capacity.

2. Description of the Related Art

The most densely integrated one of the semiconductor memory devices being practically used at present is a DRAM in which memory cells are made up of a MOS transistor and a capacitor.

In the conventional DRAM, a MOS transistor is used as a switching element which controls the access to a capacitor for storing data. The MOS transistor is a 4-terminal element which includes a source, a drain, a gate and a substrate. As the degree of integration become higher, using a 4-terminal element as the switching element becomes an obstacle to produce semiconductor memory devices having a higher degree of integration.

SUMMARY OF THE INVENTION

It is an object of the present invention to provide a semiconductor memory device which solves the above-described problem that the conventional DRAM has, and achieves a high degree of integration by introducing a new operational principle.

In the present invention, an element having a potential barrier is used as a switching element. The switching element is connected to one terminal of a capacitor so as to form a memory cell. The memory cells thus formed are arranged in a matrix manner. Another terminals of the capacitors which are not connected to the switching element are connected to each other in a direction in intersection with bit lines in the memory cell arrangement to thereby form word lines. Alternatively, the terminals of the respective capacitors which are connected to the switching elements may be connected to each other in a direction in intersection with the bit lines in the memory cell arrangement to thereby form word lines.

As described above, according to the present invention, a DRAM cell operates in a new principle in which a 2-terminal element is used as a switching element. Thus, the number of terminals of the switching element is reduced from 4 to 2 to thereby increase the degree of the integration to a great extent.

Further, by using a SOI structure in which cells are formed in a semiconductor layer formed on an embedded insulating film, (parasitic) junction capacitance with the substrate can be eliminated, so that a signal from the capacitor is transmitted reliably. In addition, since the respective cells are insulated from each other, the potential and hence the operation of the device are stabilized.

In the memory cell of the present invention, a voltage higher than the height of the potential barrier of the cell is applied across the potential barrier by lowering the potential of a word line and by raising the potential of a bit line so as to cause a current to flow through the barrier. Thus, the capacitor is charged and therefore "1" is written in the cell. Conversely, by raising the potential of the word line and by lowering the potential of the bit line so as to discharge the capacitor or charge the capacitor in a direction opposite to the writing of "1", "0" is written in the cell.

When the potential of the word line is raised, electric charges stored in the capacitor is transferred to the bit line. At this time, by detecting the potential change of the bit line, reading is performed.

According to the present invention, memory cells are arranged in a matrix, each memory cell including a capacitor and a switching element with a bidirectional potential barrier connected in series. A plurality of word lines each connects one electrode of the memory sells disposed in a direction of arrangement of the cells, a plurality of bit lines each connecting the other electrodes of the memory cells disposed in a direction in intersection with the word lines. By raising the potential of a word line from a first potential to a second potential, the potential of the bit line in a floated state is changed in accordance with the voltage across the capacitor of the memory cell. The magnitude deference between the potentials of the bit line and a reference bit line is detected and amplified. The potential of the word line is then lowered to a third potential, and then returned to the first potential to perform a rewriting operation.

Thus, the reading and writing operations can be performed by means of a potential change in the same form. Therefore, the control circuit can be operated in the same manner. Accordingly, the operation is very easy to perform.

If the first potential of the word line is equal to the precharged potential of the bit line, the maximum voltage applied across the capacitor during the holding of data can be minimized.

Further, by applying the potential of an intermediate node of a memory cell in a standby state to the precharged potential of the bit line plus or minus half of the potential barrier of the switching element depending on data "1" or "0", no voltage exceeding the potential barrier of the switching element is applied to the switching element. Therefore, destruction of the stored data is prevented even when the potential of the bit line fluctuates due to the reading operation of other memory cells.

By setting the second potential of the word line to be equal to the precharged potential of the bit line plus 3/2 or more of the voltage of the potential barrier of the switching element, the electric charges stored in the memory cell can be reliably read ont.

Further, by setting the third potential to be equal to the precharged potential of the bit line minus the voltage of the potential barrier, writing of data "1" can be fully performed.

Furthermore, by setting a higher potential side of a bit line pair to a precharged potential of the bit line plus half of the potential barrier of the switching element, by setting a lower potential side of the bit line pair to a precharged potential of the bit line minus half of the potential barrier of the switching element and by performing charging or discharging to those values, no voltage exceeding the potential barrier of the switching element can be applied across the switching element even if the potential of the bit line may change due to reading of other memory cells. Thus, destruction of the stored data is prevented.

Writing can be easily performed by forcibly reversing the potential of the bit line before the potential of the word line is lowered to the third potential.

By using as a reference bit line a dummy cell having the same structure as the memory cell and in which the intermediate level between data "1" and "0" is written, a highly reliable memory having simple structure is obtained.

Writing of a reference signal into a dummy cell is easily made by changing the potential of the dummy word line up and down by the barrier potential with respect to the potential of the bit line with the reference bit line maintained at the precharged potential.

Figure 8A:
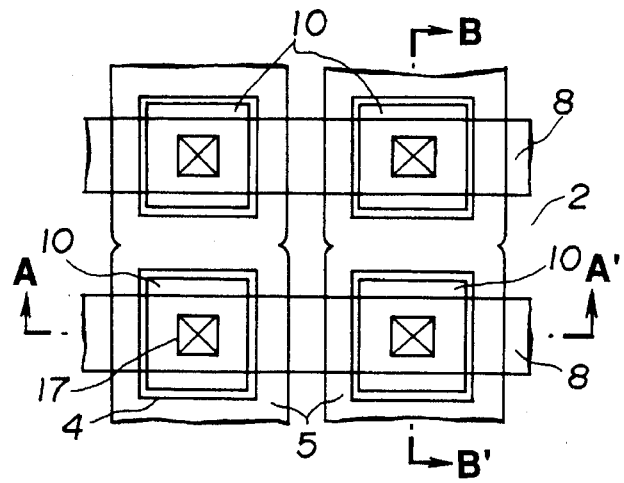
Figure 8B:
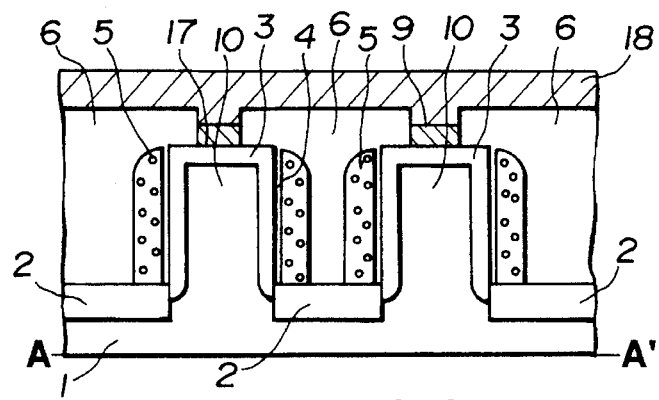
Figure 8C:
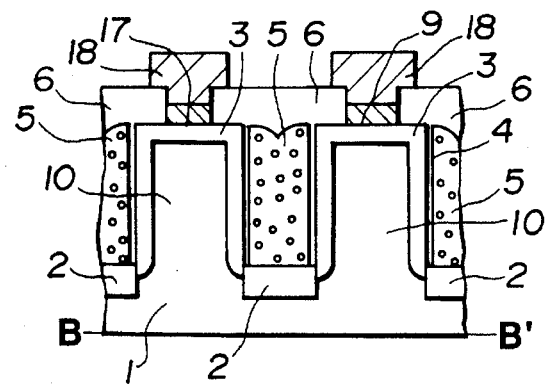
Figure 9A:
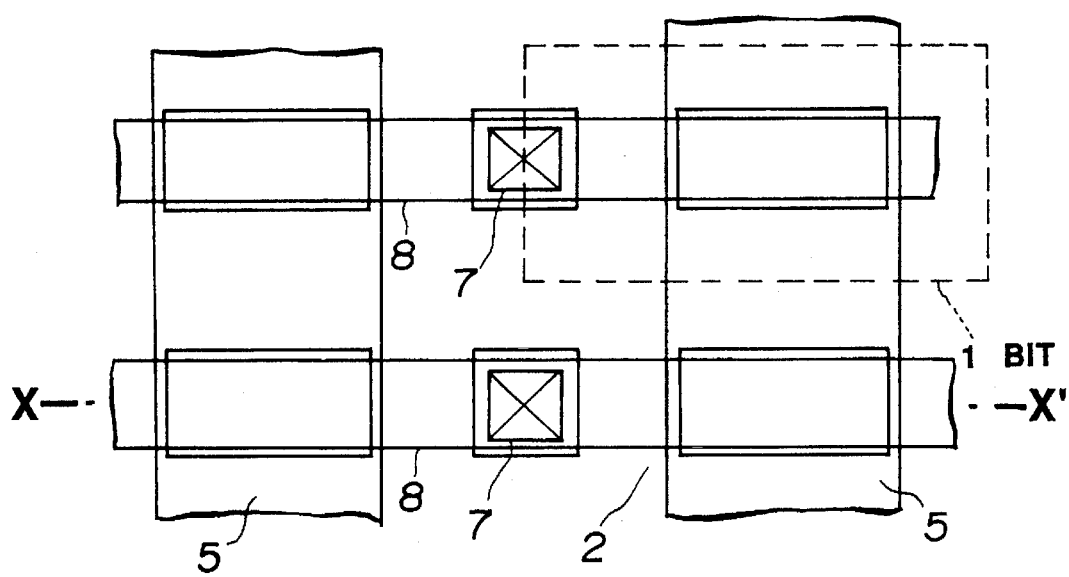
Figure 9B:
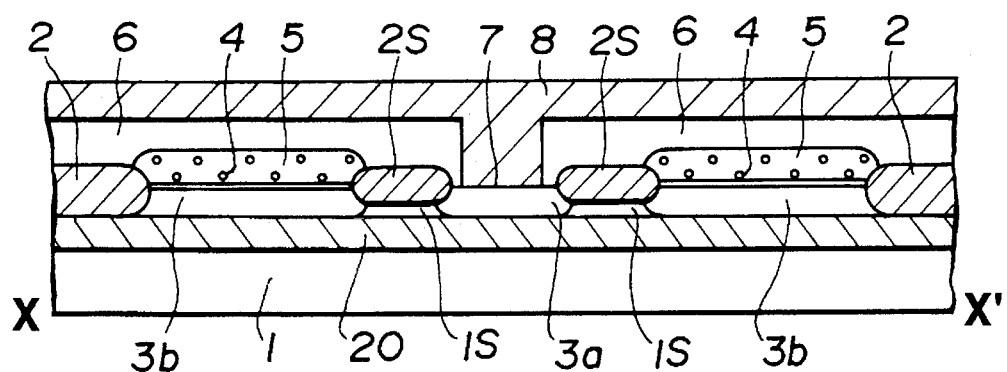
Figure 10A:
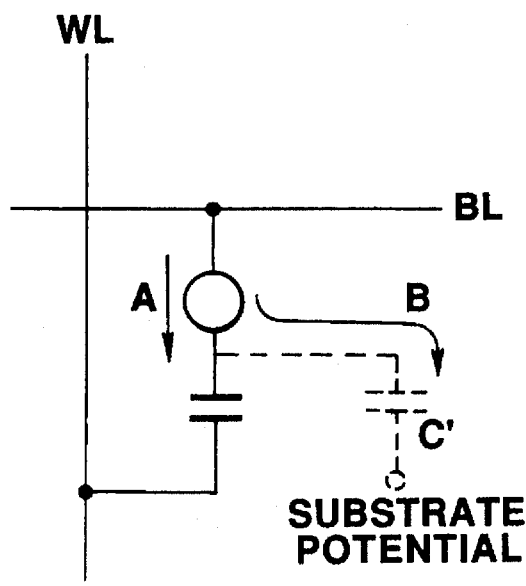
Figure 10B:
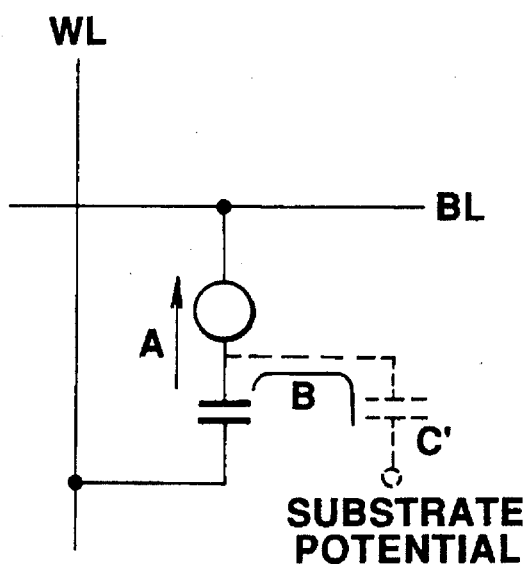
Figure 11A:
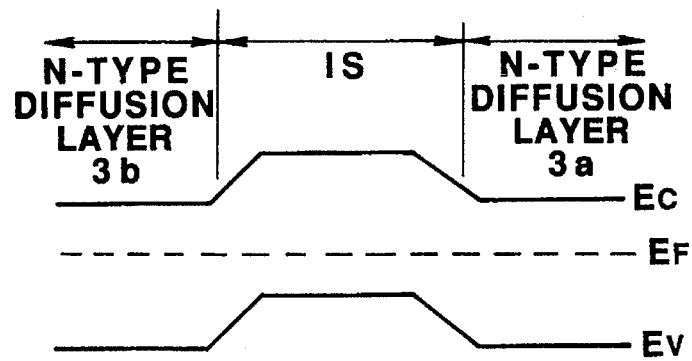
Figure 11B:
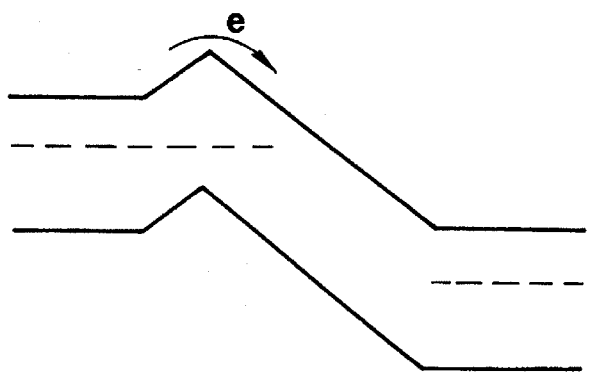
Figure 11C:
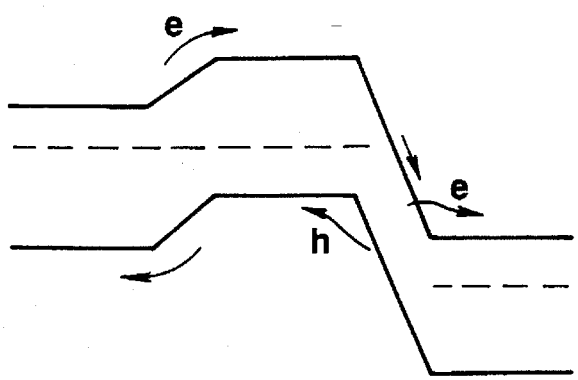
Figure 12:
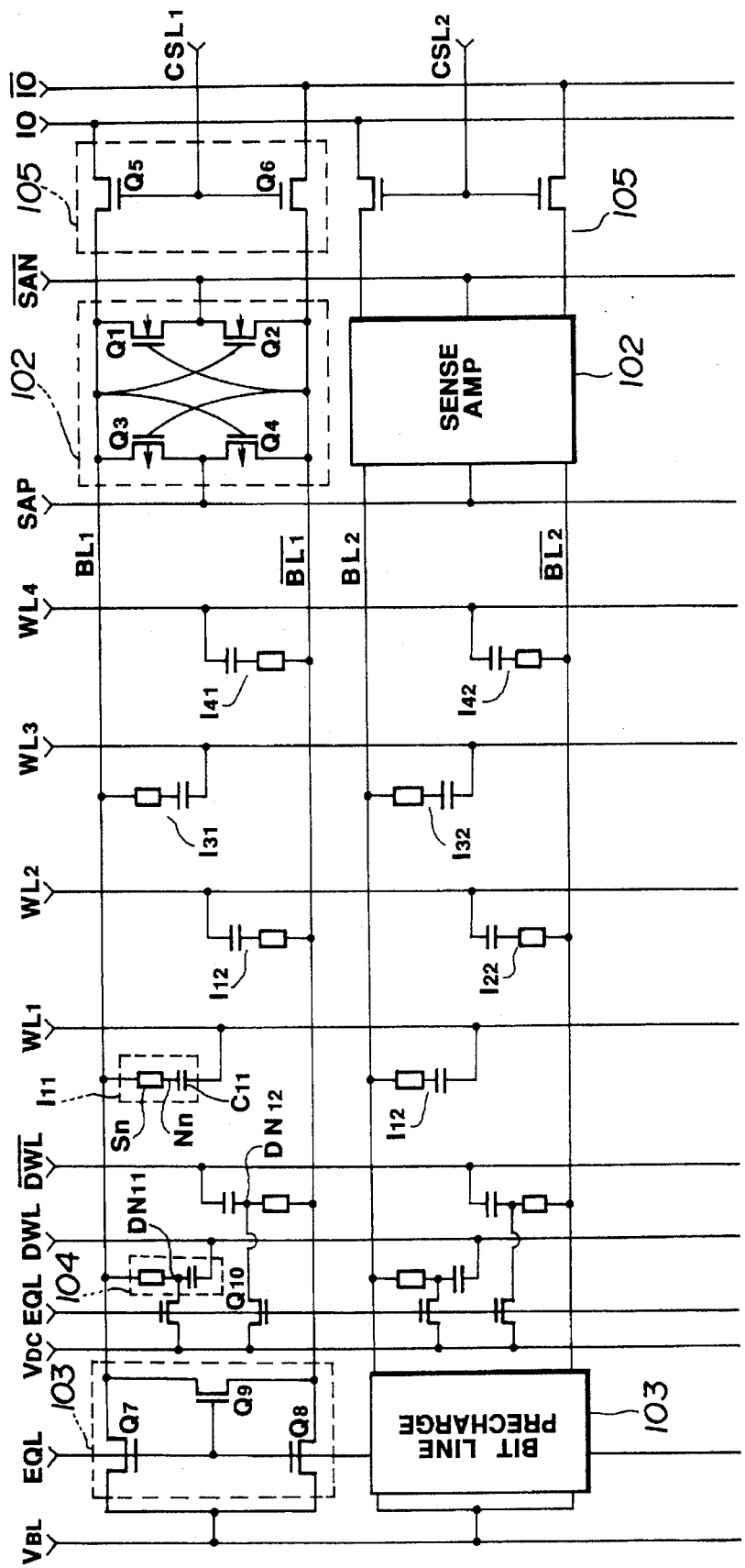
Figure 13:
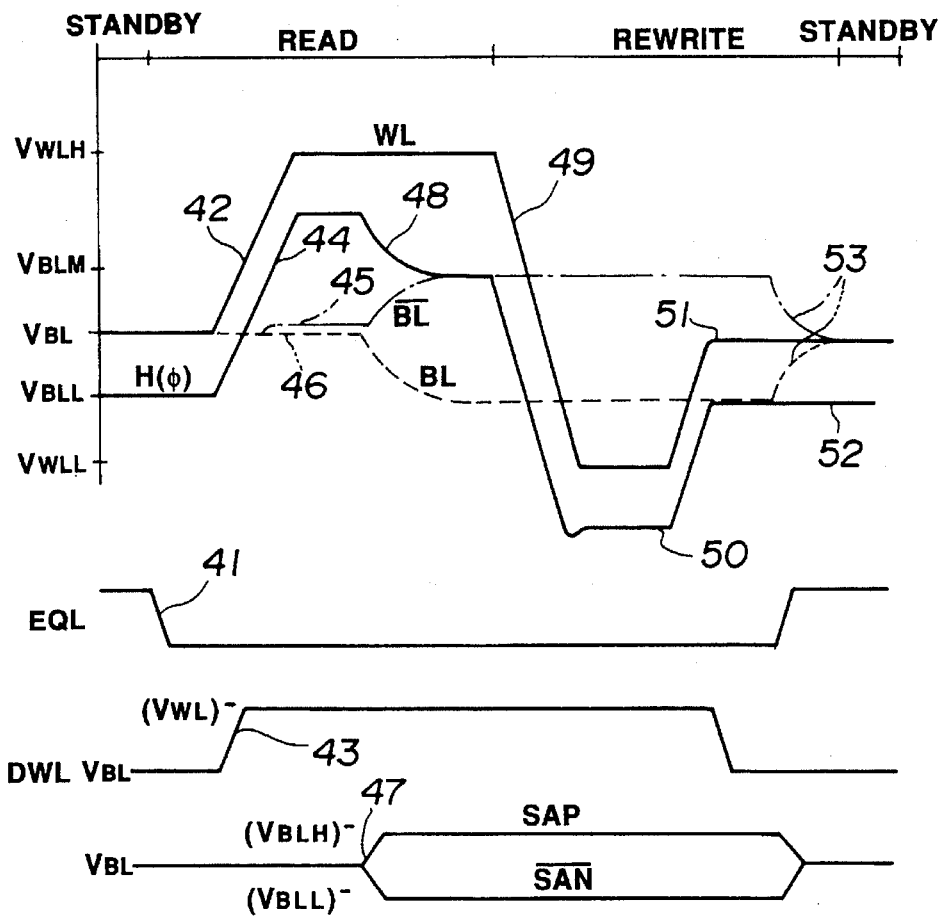
Figure 14:
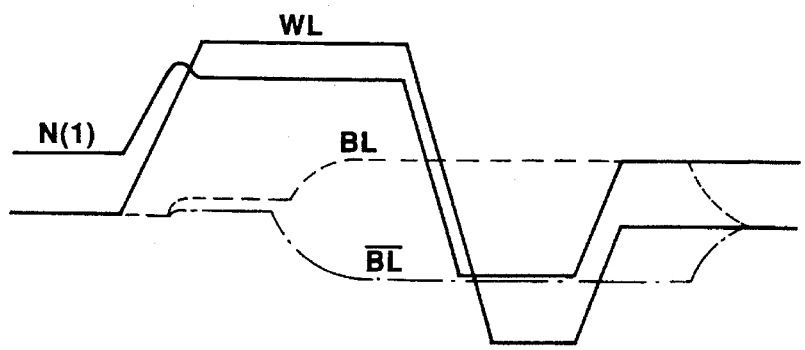
Figure 15:
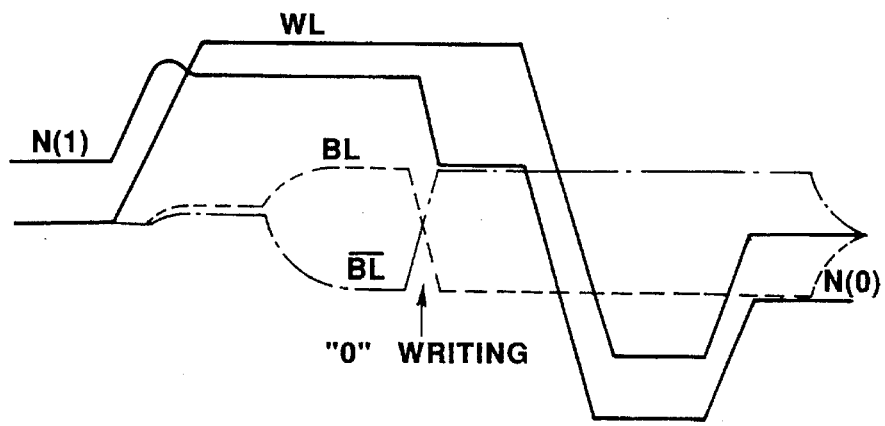
Figure 16:
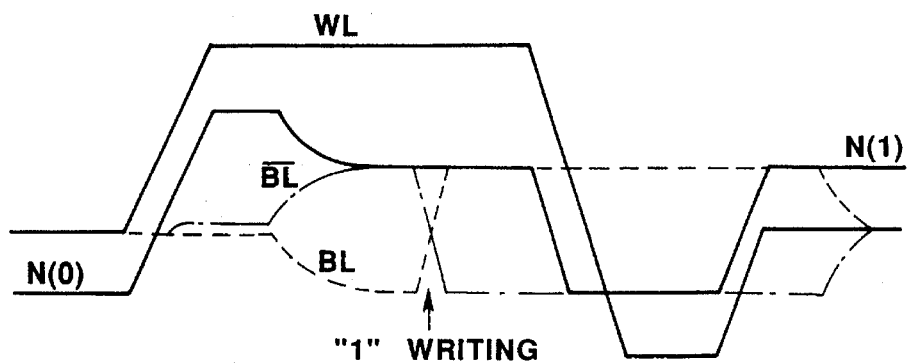
Figure 17:
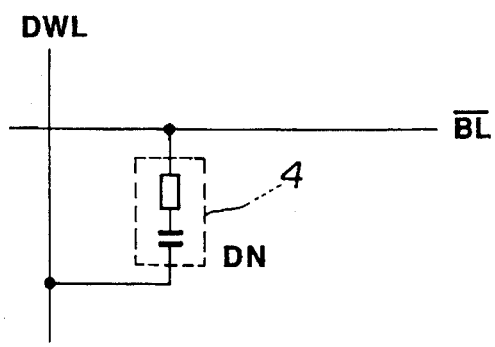
Figure 18:
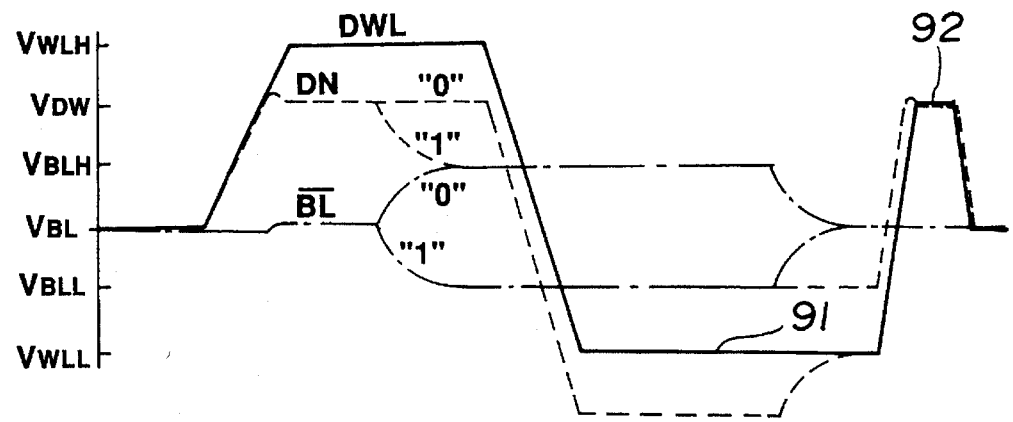
Figure 19:
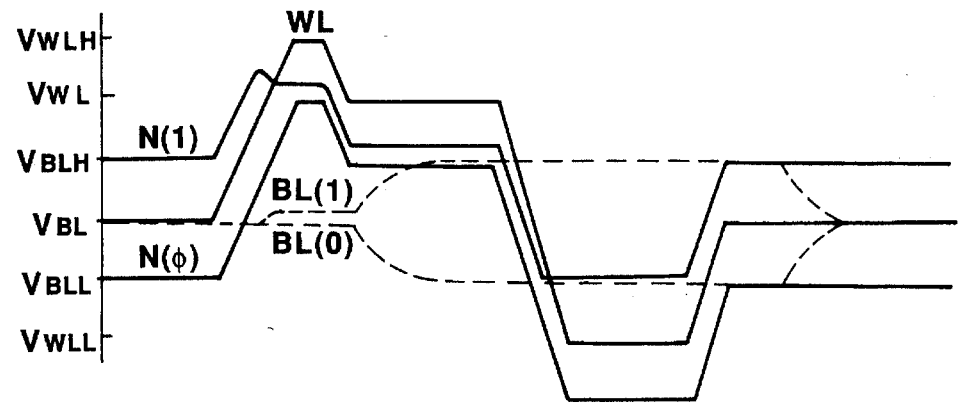
Figure 20:
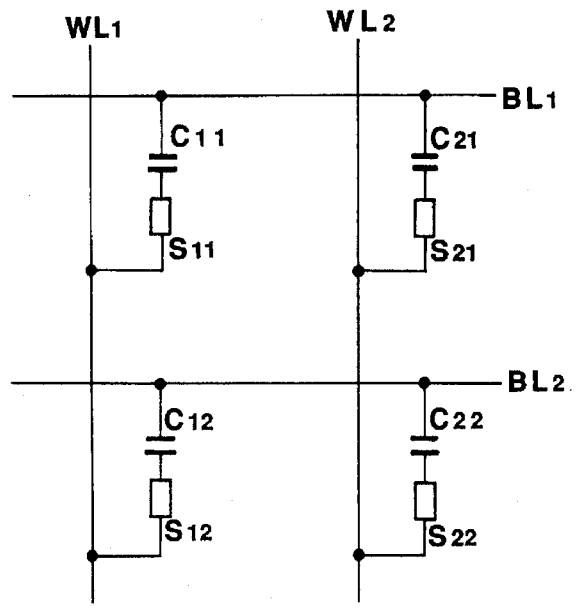
Figure 21:
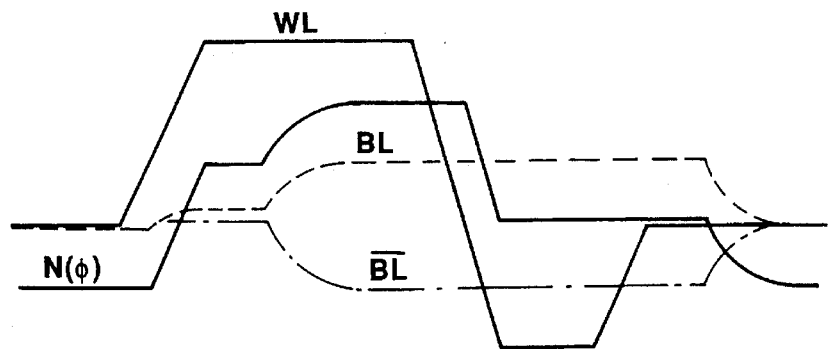
Figure 22:
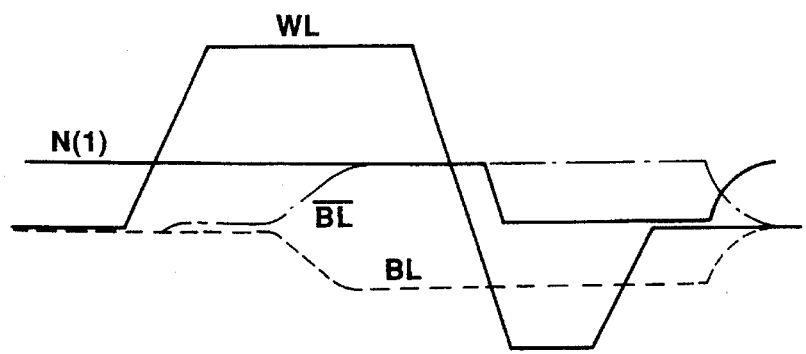
Figure 23A:
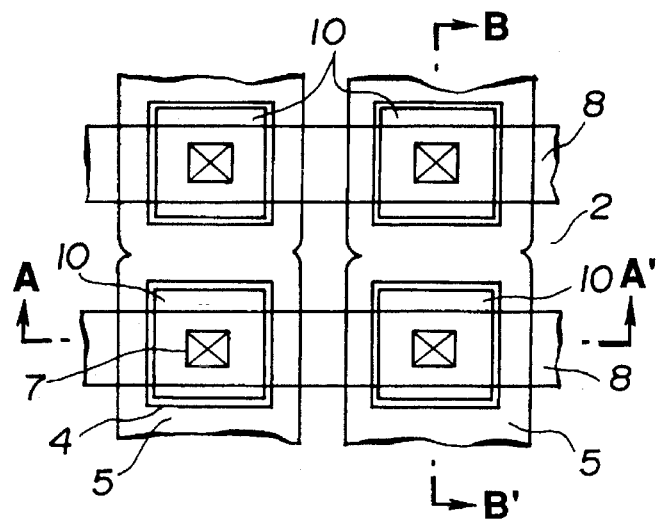
Figure 23B:
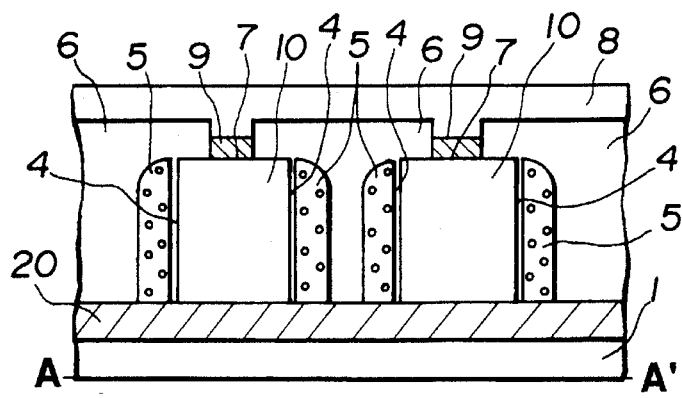
Figure 23C:
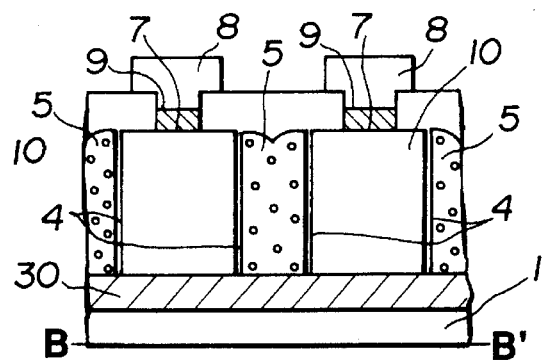

FOG. 8(a) is a plan view of a memory cell array structure of a second embodiment of the present invention;

FIGS. 8(b) and 8(c) are sectional views of the memory cell structure taken along the line A—A' and B—B' in FIG. 8(a);

FIG. 9(a) is a plan view of a memory cell array structure of a third embodiment of the present invention;

FIG. 9(b) is a cross-sectional view of the memory cell array structure taken along the line X—X' in FIG. 9(a);

FIGS. 10(a) and 10(b) are equivalent circuit diagrams of the memory cell of the third embodiment;

FIGS. 11(a), 11(b) and 11(c) illustrate examples of current-voltage characteristic of the potential barrier of the memory cell of the third embodiment;

FIG. 12 is an equivalent circuit of the memory cell array of the third embodiment;

FIG. 13 is a graph illustrating timing and potential in reading "0" from the memory cell;

FIG. 14 illustrates timing and potential in reading "1" from the memory cell;

FIG. 15 illustrates timing and potential in writing "0" into the memory cell;

FIG. 16 illustrates timing and potential in writing "1" into the memory cell;

FIG. 17 illustrates the structure of a dummy cell;

FIG. 18 illustrates the operation of the dummy cell;

FIG. 19 illustrates another example of the operation of a word line;

FIG. 20 illustrates a modification of the memory cell connection;

FIG. 21 illustrates timing and potential in reading "0" from the memory cells connected as in FIG. 20;

FIG. 22 illustrates timing and potential in reading "1" from the memory connected as in FIG. 20;

FIG. 23(a) is a plan view illustrating the structure of a memory cell of a fourth embodiment of the present invention;

FIGS. 23(b) and 23(c) are sectional views of the memory cell taken along lines A—A' and B—B' in FIG. 23(a)

Figure 24A:
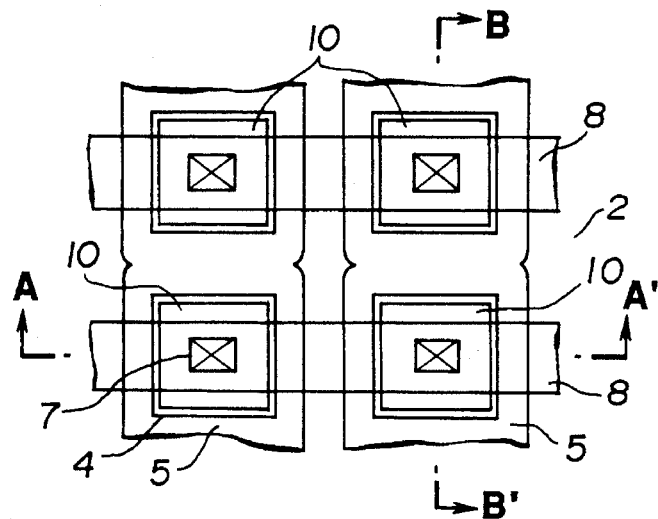
Figure 24B:
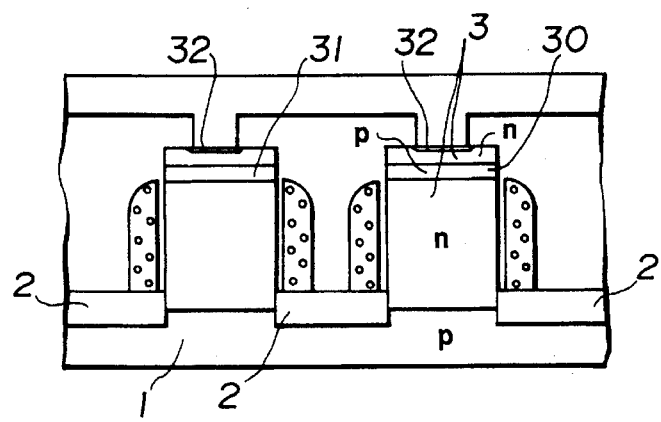
Figure 24C:
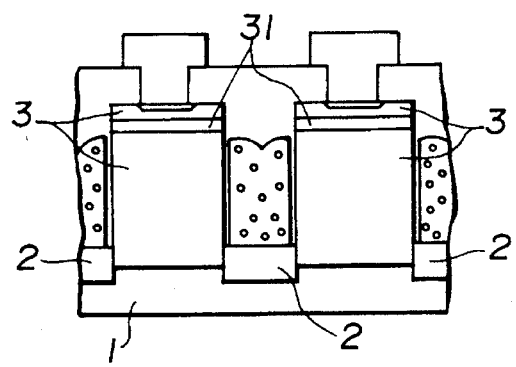
Figure 25A:
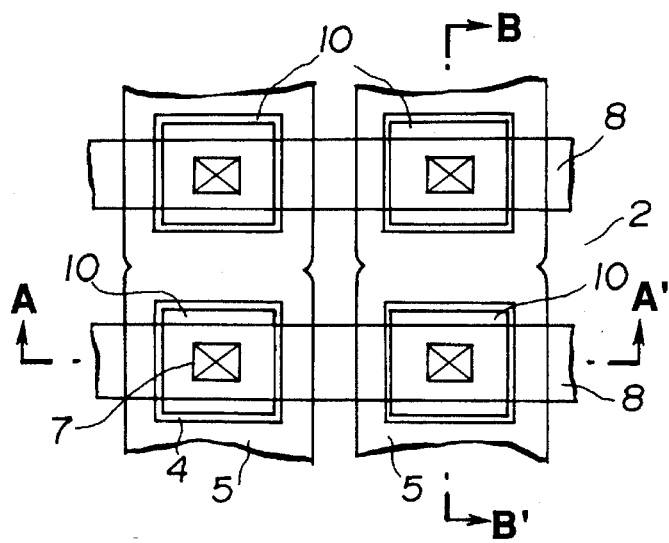

FIGS. 24(a), 24(b) and 24(c) illustrate the structure of a memory cell of a fifth embodiment of the present invention; and FIGS. 25a), 25(b) and 25(c) illustrate the structure of a memory cell of a sixth embodiment of the present invention.

DETAILED DESCRIPTION OF THE EMBODIMENTS

Embodiments of the present invention will be described with reference to the drawings.

Embodiment 1

Figure 1A:
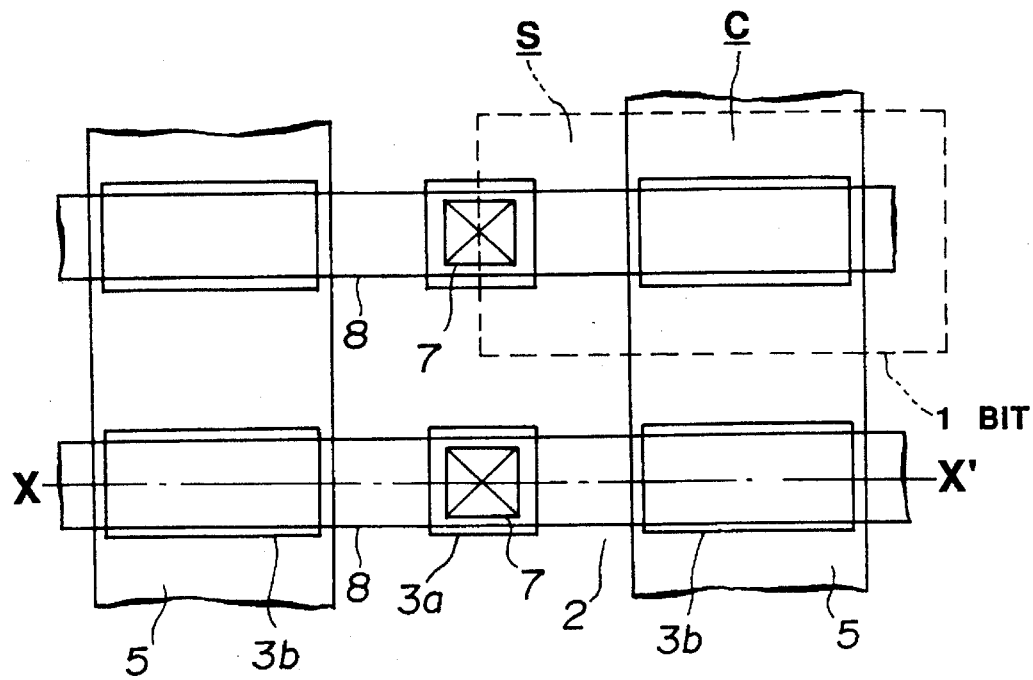
FIG. 1(a) is a plan view illustrating the structure of a memory cell array of a first embodiment of the present invention.
Figure 2:
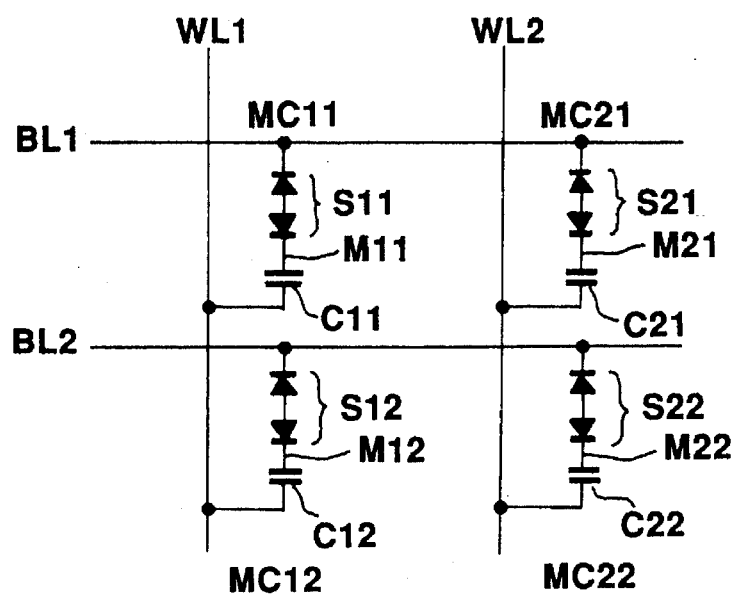
FIG. 2 is an equivalent circuit diagram of the memory cell array of the first embodiment.

FIGS. 1(a) and (b) illustrate a 4-bit memory cell array of the first embodiment, and FIG. 2 illustrates an equivalent circuit of the memory cell array.

In a DRAM, there are provided a plurality of memory cells each comprising a switching element S and a capacitor C for storing data arranged in matrix on a p-type silicon substrate 1. The DRAM is constructed as follows.

Figure 1B:
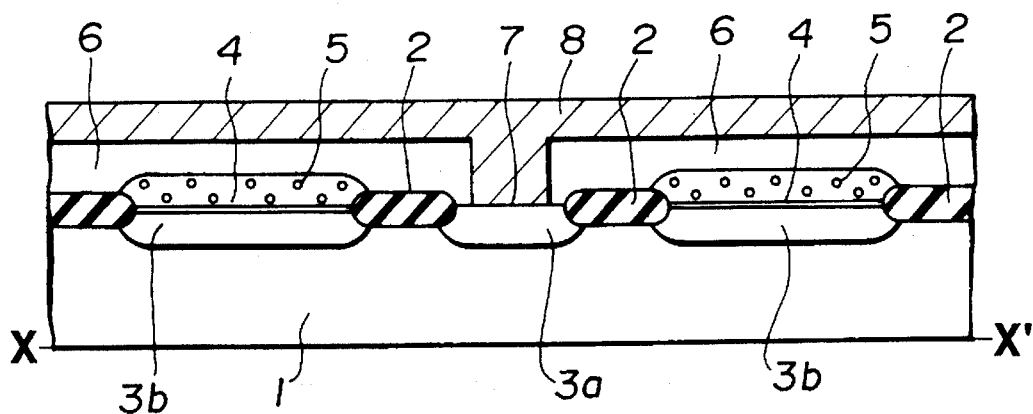
FIG. 1(b) is a cross-sectional view taken along the line X—X' of FIG. 1(a)

An element isolation insulating film 2 is formed on the p-type silicon substrate 1 using selective oxidation or the like. First n-type diffusion layers 3a and second n-type diffusion layers 3b are alternately arranged in the row direction in a region enclosed by the insulating film 2 to form memory cells. As shown in FIG. 1, the first and second n-type diffusion layers 3a and 3b are arranged in lines in the column direction. The second n-type diffusion layer 3b constituting the capacitor is larger than the first n-type diffusion layer 3a in order to increase the capacity of the capacitor.

The capacitor comprises the second diffusion layer 3b as a first electrode, a capacitor insulating film 4 of a 2-layered structure consisting of a silicon nitride film and a silicon oxide film laminated successively on the second diffusion layer 3b, and a capacitor electrode 5 as a second electrode made of a polycrystalline silicon film. The capacitor electrode 5 extends for a plurality of memory cells arranged in the column direction so as to serve as a word line (WL). The substrate surface on which the word lines are formed is covered with a first inter-layer insulating film 6 in which a bit line contact 7 is formed for connection with the first n-type diffusion layers.

Each switching element S uses as a potential barrier a punch-through breakdown voltage or a junction breakdown voltage between the first diffusion layer 3a as the third electrode and the second diffusion layer 3b as the first electrode. The switching element is connected to a bit line (BL) 8 made of an aluminum layer which is connected to the first diffusion layer 3a through the bit line contact 7. The bit lines 8 extend so as to be connected to the first diffusion layers 3a of a plurality of memory cells which are disposed in the direction in intersection with the word lines through the bit line contacts 7.

In this embodiment, the punch-through breakdown voltage or the junction breakdown voltage between the first and second n-type diffusion layers 3a and 3b are used as the potential barriers of the switching elements. Since the switching element is of two terminals made of the diffusion layers 3a and 3b, the device can be made in extremely small size.

The manufacturing of the memory device according to this embodiment comprises the same processed, for example, as in manufacturing conventional DRAM memory cells. However, a process for forming the gate electrodes of the MOS transistors can be omitted. Therefore, the processes can be simplified.

More specifically, the manufacturing of the memory device according to this embodiment comprises the steps of forming a element isolation insulating film 2 by selective oxidation or the like on a surface of the silicon substrate 1, forming n-type diffusion layers 3a, 3b by using as a mask the element isolation insulating film 2, forming capacitor insulating films 4 on second n-type diffusion layers 3b, forming a polycrystalline silicon layer as a capacitor electrode 5 serving as a word line, patterning the polycrystalline silicon layers to form capacitors, forming an inter-layer insulating film 6, forming bit line contacts 7 and forming bit lines 8 made of an aluminum layer through barrier metal layers (not shown) made of tungsten nitride.

The operation of the DRAM is as follows.

Figure 3:
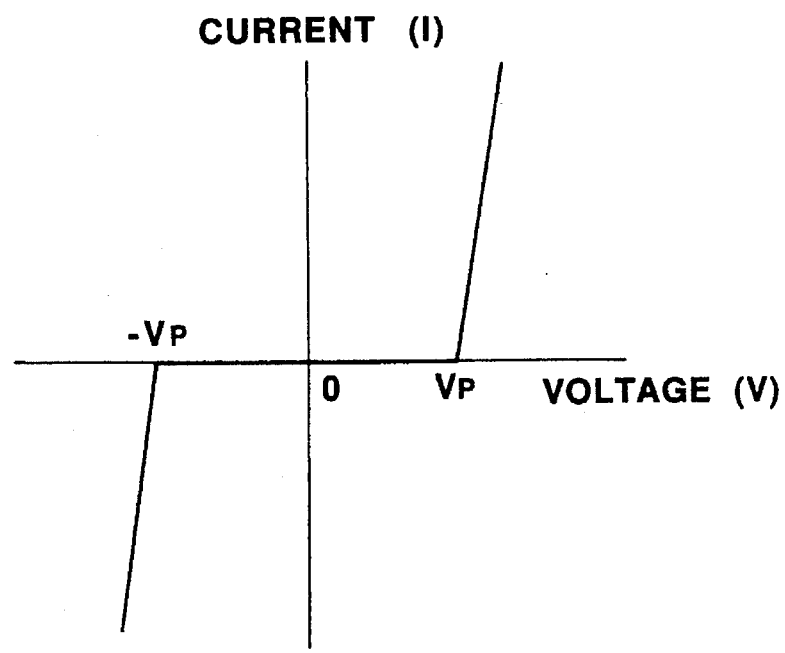
FIG. 3 illustrates a typical current-voltage characteristic of the potential barrier of the memory cell.

As in conventional DRAM, a memory cell of this embodiment stores data "1" or "0" depending on the voltage across the capacitor electrodes. It is assumed that the current-voltage characteristics of the potential barrier elements S11, S12, S21, S22 shown in of FIG. 2 are such that when these elements are applied with a voltage exceeding $V_p$ or below $-V_p$, a large current rapidly starts to flow as shown in FIG. 3. In writing data "1", the potential of the word line WL is lowered while the potential of bit line BL is raised to charge the capacitor through the potential barrier. In writing data "0", the potential of the word line WL is raised while the potential of the bit line BL is lowered to discharge the capacitor through the potential barrier or to charge the capacitor to a potential opposite to that applied when data "1" is written. In reading data, firs the bit line BL is charged to a certain potential and then is made in floating state. Thereafter, the potential of the word line is raised and the potential change in the bit line is detected when the electric charges stored in the capacitor is transferred to the bit line through the potential barrier.

The operating cycle of the memory cell in this embodiment will now be described by referring to FIGS. 4–7.

Figure 4:
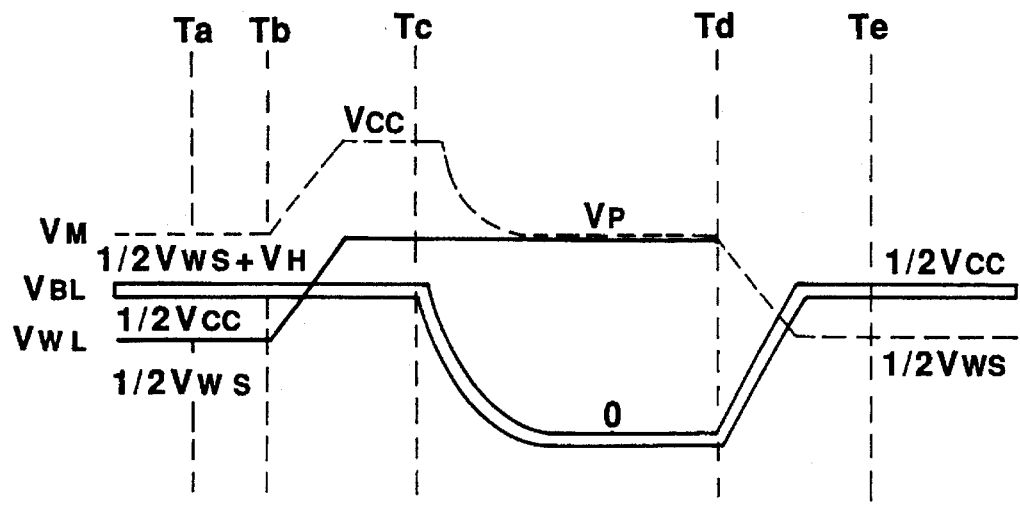
FIG. 4 illustrates timing and potential in writing of "0"
Figure 5:
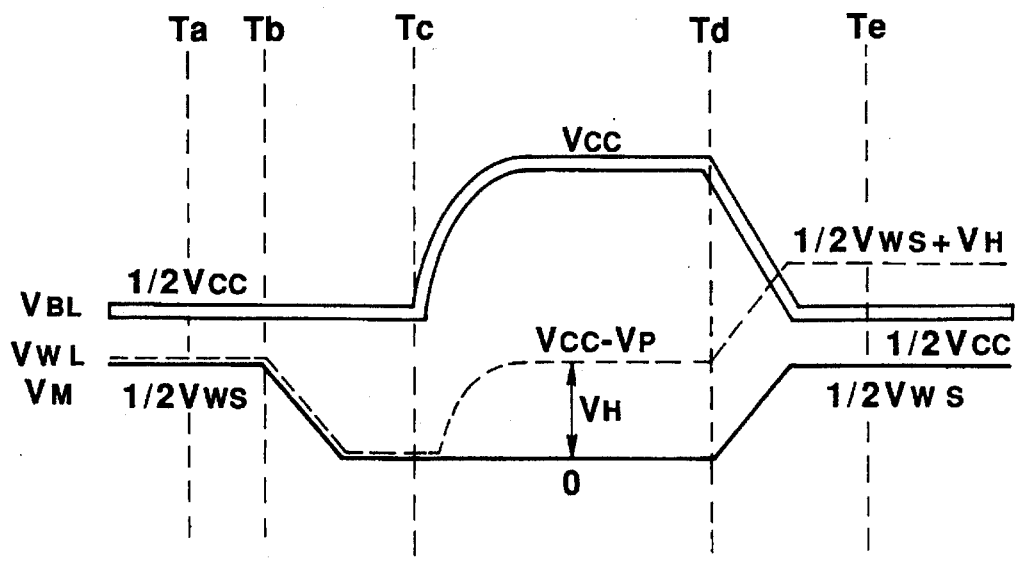
FIG. 5 is illustrates timing and potential in writing of "1"

Referring to FIGS. 4 and 5, it is assumed that at a time Ta immediately before writing, the word line potential $V_{WL}=(½)×V_{WS}$ where $V_{WS}$ shows any voltage, the bit line potential $V_{BL}=(½)×V_{CC}$ and a memory cell in which "0" is to be written stores data "1" while a memory cell in which "1" is to be written stores data "0". When "0" is to be written, the initial potential of the storing node ($M_{11}$, $M_{12}$, $M_{21}$, $M_{22}$ in FIG. 2) is $V_M=(½)×V_{WS}+V_H$ where $V_H=V_{CC}-V_p$ where $V_p$ corresponds to $V_p$ of FIG. 3 and when "1" is to be written, $V_M=(½)×V_{WS}$.

At a time Tb, a word line is selected and the potential $V_{WL}$ of the selected word line is changed from $(½)×V_{WS}$. That is, when "0" is to be written, $V_{WL}$ is set to $V_p$ while "1" is to be written, $V_{WL}$ is set to 0.

By this operation, the potential $V_M$ of the storing node also changes due to coupling. When "0" is to be written, the potential $V_M$ rises to $V_{CC}$. When "1" is to be written, $V_M=0$.

When "0" is to be written at a time Tc, the bit line potential is lowered to 0 V to thereby discharge the capacitor and lower the memory node potential $V_M$ to $V_p$. When "1" is to be written, the bit line potential is raised to $V_{CC}$ to thereby charge the capacitor and hence raise the storage node potential $V_m$ to $V_{CC}-V_p=V_H$. Thus, no electric charges are stored in the capacitor when "0" is written while electric charges for the capacitor potential $V_H$ are stored in the capacitor when "1" is written.

Thereafter, at a time Td, the word line potential $V_{WL}$ is returned to $(½)×V_{WS}$ to bring about a non-selective state in which the bit line potential $V_{BL}$ is charged or discharged to $(½)×V_{CC}$ to terminate the writing operation.

Figure 6:
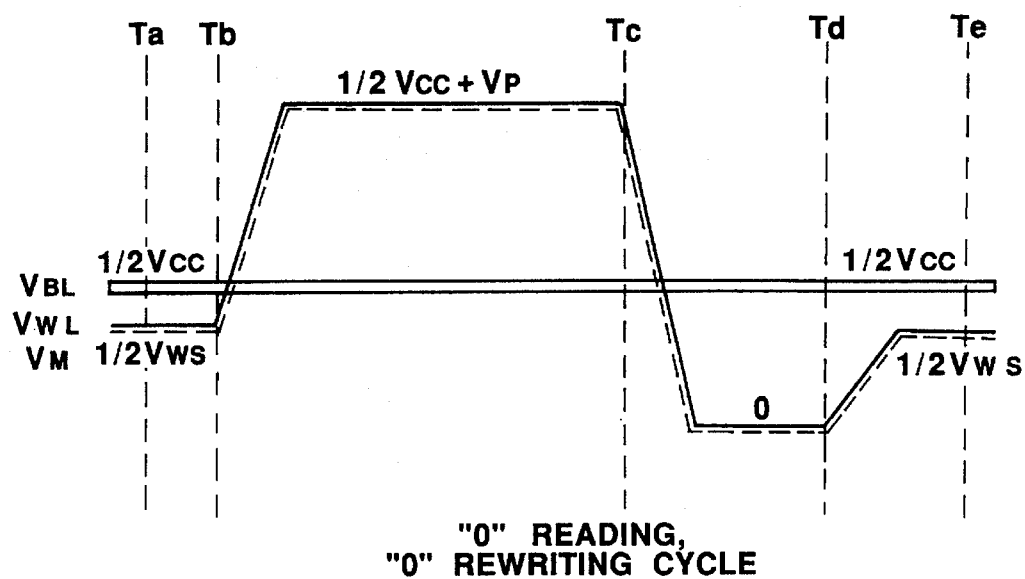
FIG. 6 illustrates timing and potential at each node of the memory cell in "0" reading and "0" rewriting cycle.
Figure 7:
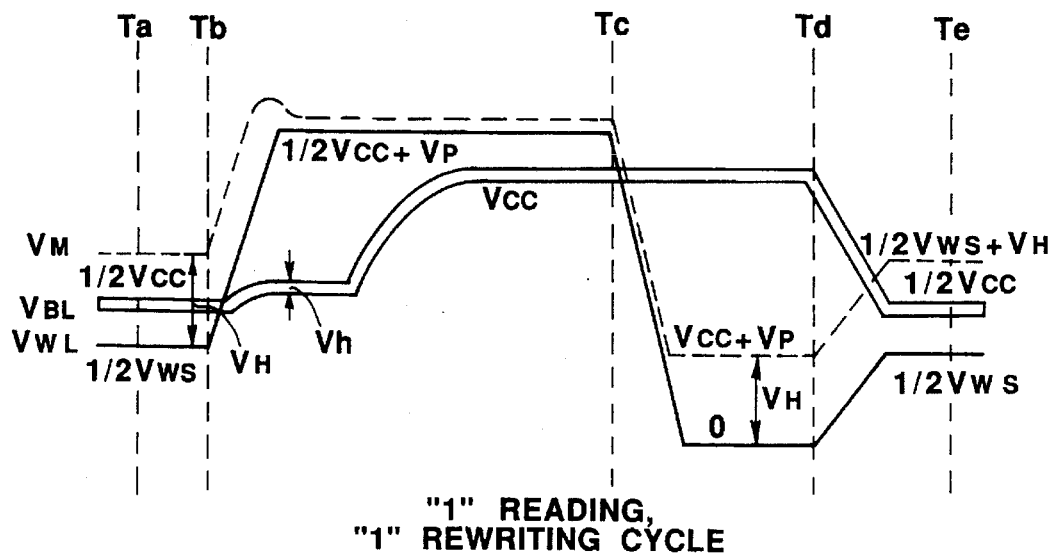
FIG. 7 illustrates timing and potential at each node of the memory cell in "1" reading and "1" rewriting cycle.

Referring to FIGS. 6 and 7, at time Ta immediately before reading, the word line potential $V_{WL}=(½)×V_{WS}$, and the bit line potential $V_{BL}=(½)×V_{CC}$. At that time, the storing node potential $V_M$ is $V_M=(½)×V_{WS}+V_H$ in the memory cell with data "1" while $V_M=(½)×V_{WS}$ in the memory cell with data "0". At time Tb, a word line is selected and the potential $V_{WL}$ of the selected word line is raised from $(½)×V_{WS}$ to $(½)×V_{CC}+V_p$ or more (in FIGS. 6 and 7, to $(½)×V_{CC}+V_p$). At this time, the storing node potential $V_M$ is also raised due to the coupling.

In the memory cell with data "0", $V_M$ is raised to $(½)×V_{CC}+V_p$. However, no current flows through the barrier. In the memory cell with data "1", the potential $V_M$ is not raised up to $(½)×V_{CC}+V_p+V_H$ and a potential difference $V_p$ or more occurs across the potential barrier at $V_M=(½)×V_{CC}+V_p$. Therefore, a current flows from the storing node toward BL. If CB>>CS where CB is the bit line capacity and CS is the memory cell capacity, the potential $V_M$ becomes substantially equal to $V_M=(½)×V_{cc}+V_p$. Thus, no current flows through the potential barrier in the memory cell with data "0" and hence $V_{BL}$ is maintained at $(½)×V_{CC}$. While in the memory cell with data "1", the electric charges are divided between the cell capacitor and the bit line capacity through the potential barrier. As a result, the potential $V_{BL}$ rises ($V_h$ in FIG. 7).

Changes in the bit line potential due to the data "0" and "1" are amplified, for example, by a sense amplifier and the reading operation is completed.

Then, the selected word line is lowered to 0 to enter a rewriting cycle (at time Tc). If "1" has been read out until this time, the bit line is amplified to $V_{CC}$ while if "0" has been read out, the bit line is amplified to $(½)×V_{CC}$. If the selected word line is lowered to 0 V, the storing node potential is also lowered. At this time, $V_M$ is lowered to 0 V in the memory cell where "0" has been read out. This is because the bit line potential at this time is $(½)×V_{CC}$ and as a result, only the voltage $V_p$ or less is applied across the potential barrier ($V_{CC}<2 V_p$), whereby no current flows. Therefore, the storing node potential changes according to the change in the word line potential and is lowered to $V_M=0$.

Meanwhile, $V_{BL}$ equals to $V_{CC}$ in the memory cell where "1" has been read out. Therefore, the capacitor is charged through the potential barrier when $V_M=V_{CC}-V_p$ and is clamped to $V_{CC}-V_p=V_H$. In this way, electric charges corresponding to 0 V are stored in the capacitor in the rewriting of "0" while the electric charges corresponding to the potential $V_H$ are stored in the rewriting of "1". Thereafter, the word line potential $V_{WL}$ is returned to $(½)×V_{WS}$ so that the word line is not selected (at time Td) and the bit line where "0" or "1" has been rewritten is charged or discharged to $(½)×V_{CC}$. Thus, the rewriting cycle is terminated (at time Te).

Although the first embodiment of the present invention has been described above, the invention is not limited to it. For example, in this embodiment, 0 and $V_H$ volts of the voltage applied to the capacitor correspond to data "0" and "1", respectively. However, by selecting the potential of the word line on standby appropriately, it is possible to set the voltage applied to the capacitor to be $+\Delta V1$, $-\Delta V1$; $+V1$, $+V2$; or $-V1$, $-V2$ (V1, V2>0) corresponding to data "0" and "1", respectively.

This embodiment may be modified within the scope of this invention without departing from its technological concept. For example, the substrate may be set at a predetermined potential to form a 3-terminal switching element. While the above embodiment includes a flat type capacitor where the n-type diffusion layer is used as a storage node of the capacitor, a so-called stack type capacitor may be provided which comprises a new storage node electrode formed so as to contact the n-type diffusion layer and to reach the source separating region and which further comprises a capacitor insulating film and a plate electrode formed on the storage electrode. In a DRAM structure, the capacitor may be not only flat type capacitors, but also other capacitors having a structure, for example, of a trench type.

Embodiment 2

The structure of a cross point type memory cell array will be described as a second embodiment of the present invention.

As shown in FIGS. 8(a), (b) and (c), each memory cell comprises a p-type silicon column 10 separated from each other by element isolation insulating film 2 formed in grooves which extend longitudinally and transversely on a p-type silicon substrate surface 1.

capacitors each comprise an n-type diffusion layer 3 as a first electrode formed on the top and sides of the silicon column 10, a capacitor insulating film 4 having a 2-layered structure comprising a silicon nitride film and a silicon oxide film covering the sides of the diffusion layer 3, and a capacitor electrode 5 as a second electrode and made of a polycrystalline silicon film formed in the grooves so as to cover the outer sides of the insulating film 4. The capacitor electrode 5 extends over a plurality of memory cells arranged in one direction to serve as a word line WL. The surface of the substrate on which the word lines are formed is covered with a first inter-layer insulating film 6 with contact holes 17 for forming switching elements S.

A p-type doped single crystalline silicon layer 9 is formed by selective growth from the n-type diffusion layer 3 on the top of the silicon column exposed in the contact hole 17. The switching element S uses the p-type doped single crystalline silicon layer 9 as a potential barrier layer, and utilizes a punch-through breakdown voltage or a junction breakdown voltage between an n-type diffusion surface (not shown) in the p-type single crystalline silicon layer 9 formed by diffusing impurities from an n-type polycide layer (which is of 2-layered structure including an n-type polycrystalline silicon layer and a tungsten silicide layer) serving as a third electrode and a bit line 18 and the n-type diffusion layer 3 as a first electrode.

The bit line 18 is formed on the inter-layer insulating film 6 covering the surface of the substrate. The bit line 18 extends over a plurality of the single crystalline silicon layers 9 formed in the contacts 17 of a plurality of the memory cells arranged in the direction in intersection with the word lines.

In this embodiment, a punch-through breakdown voltage or a junction breakdown voltage of the single crystalline silicon layer 9 formed on the n-type diffusion layer 3 is used as the potential barrier of the switching element. Since the switching element is of two-terminal, it is possible to reduce the size of the device to a great extent.

Further, with the above-described structure, it is possible to increase the area of the capacitor by increasing the depth of the side walls of the silicon column 10. Therefore, one memory cell can be formed by only the top area of the silicon column 10 forming the bit line contact. Thus, it is possible to realize a high degree of integration.

The operation of this embodiment is the same as the embodiment 1.

Embodiment 3

FIGS. 9(a) and (b) show a 4-bit memory cell array of a third embodiment of the present invention.

The DRAM of this embodiment is the same as embodiment 1 except that it adopts the SOI (Silicon on Insulator) structure and its potential is separated from that of the substrate.

Memory cells each comprises a switching element S and a data storing capacitor C, and are arranged in a matrix on a silicon region of an oxide silicon film formed on the silicon substrate. That is, an embedded $SiO_2$ layer 20 is formed in silicon substrate 1 by SIMOX (Separation by Implanted Oxygen) process or the like processes, an element isolation insulating film 2 is formed on the p-type silicon layer formed on the layer 20 using selective oxidation or the like process as in embodiment 1, a first and a second n-type diffusion layers 3a and 3b are arranged alternately in the horizontal (row) direction in FIG. 9 in region 1s enclosed by the insulating film 2 and the layer 20 to thereby form memory cells as in embodiment 1. In FIG. 9, first and second n-type diffusion layers 3a and 3b are arranged in the vertical (column) direction such that these layers form a line in the column direction, respectively. The size of the second n-type diffusion layer 3b is larger than that of the first n-type diffusion layer 3a in order to increase the capacity of the capacitor.

Each capacitor comprises the second diffusion layer 3b as a first electrode, a capacitor insulating film 4 of a 2-layered structure comprising a silicon nitride film and a silicon oxide film laminated successively on the second diffusion layer 3b and a capacitor electrode 5 as a second electrode made of a polycrystalline silicon film. The capacitor electrode 5 extends over a plurality of memory cells arranged in one direction so as to become a word line WL. The surface of the substrate on which the word lines are formed is covered with a first inter-layer insulating film 6 with bit line contact holes 7 for connection with the first n-type diffusion layers.

In the switching element S, a punch-through breakdown voltage or a junction breakdown voltage between the first diffusion layer 3a (third electrode) and the second diffusion layer 3b (first electrode) is used as a potential barrier. The switching element S is connected to a bit line (BL) 8 which is made of an aluminum layer and contacts with the bit line contact 7 formed in the inter-layer insulating film 6. The bit line 8 extends so as to be connected to a plurality of the bit line contact holes 7 of the memory cells arranged in the direction in intersection with the word lines.

According to this embodiment, no junction (parasitic) capacitance is formed with the substrate and a signal from the capacitor is completely transmitted, in addition to the advantageous effects produced by the embodiment 1.

Since the memory cells are separated from each other, the potentials are stabilized, so that the operation of the device is stabilized.

The advantages of this embodiment will be described referring to the equivalent circuit diagram shown in FIGS. 10(a), (b) and 11(a), (b), (c).

In the structure of the embodiment 1, the parasitic capacitance formed between a capacitor and the substrate brings about the following problems.

When a parasitic capacitance C' exists as shown by a broken line in FIG. 10(a), charges flow in both directions A and B when data is written. The data is also written into the parasitic capacitance C'. Therefore, excess electric charges are required, which influences the operational margin and speed.

When the data is read out, the stored electric charges are transferred to the bit line by forming a flow of electric charges in the direction A. However, there is a leakage flown into the parasitic capacitance C' shown by the arrow B, so that transfer loss occurs, which reduces the operation margin of the device.

In contrast, in embodiment 3, the capacitors are isolated from the substrate by an embedded insulating film 20. Accordingly, no parasitic capacitance exists, and therefore stabilized reliable data writing and reading can be achieved.

The punch-through breakdown voltage or junction breakdown voltage of the first and second n-type diffusion layers 3a, 3b used as the potential barriers of the switching elements in this structure will be described in more detail.

FIG. 11(a) shows a thermally balanced energy state existing when no voltage is applied across the two terminals of the switching element in which Ec denotes an energy level at the bottom of a conduction band; EF a Fermi level; and $E_V$ an energy level at the top of a valence band. The potential states of the diffusion layers 3a, 3b change depending on the potential state of the word line and bit line. Assume now that the potential of the diffusion layer 3a is raised relative to the potential of the diffusion layer 3b. Most of the electric field at this time is applied across the junction of the diffusion layer 3b and p-type silicon region 1s and across the junction of the diffusion layer 3a and silicon region 1s. The latter voltage is higher than the former voltage.

When the impurity concentration of the p-type silicon layer region 1s is lower then that of the n-type diffusion layers 3a, 3b, a large depletion layer at the pn junction of the p-type silicon layer 1s and n-type diffusion layer 3a extends toward the p-type silicon region 1s with a lower impurity concentration. If the potential of the n-type diffusion layer 3a exceeds a certain potential, the depletion layer arrives at the junction between the n-type diffusion layer 3b and p-type silicon region 1s, as shown in FIG. 11(b), which is a so-called punch-through state, and hence a large current flows between the n-type diffusion layers 3a and 3b. The punch-through breakdown voltage or the junction breakdown voltage greatly depends on the concentrations of the layers 3a, 3b and p-type silicon region 1s and the length (channel length) of the p-type silicon region 1s.

When the impurity concentration of the p-type silicon region 1s is large so that a punch-through is difficult to occur, the depletion layer deviates toward the p-type silicon region 1s and does not extend even if a potential is applied to the n-type diffusion layer 3a. In this case, as shown in FIG. 11(c), the electric field across the junction of the n-diffusion layer 3a and the p-type silicon region 1s increases rapidly, so that breakdown occurs before punch-through occurs. There are two types of the breakdown; a breakdown due to avalanche multiplication and a Zener breakdown due to tunnel effect. As the impurity concentration becomes larger, the Zener breakdown is more likely to occur.

In any event, if a breakdown occurs, many positive holes h are implanted into the p-type silicon region 1s, so that the potential of the p-type silicon region 1s increases and the junction between the p-type silicon region 1s and n-type diffusion layer 3b is biased in forward direction. Thus, a current flows between the n-type diffusion layers 3a and 3b.

In manufacturing, after the step of forming an embedded silicon oxide layer 20 in the silicon substrate by SIMOX or the like, same steps are performed as in the embodiment 1.

That is, an embedded silicon oxide layer 20 is first formed in the silicon substrate. Element isolation insulating films 2 and small-sized element isolation insulating films 2s are formed on the substrate surface by selective oxidation or the like to thereby form n-type diffusion layers 3a, 3b by using the element isolation insulating films as a mask. At this time, in the region of the element isolation insulating film 2s, thickness of the isolating oxide film is thinner than that of other regions due to the thinning effect specific to selective oxidation. Therefore, there exist an unoxidized p-type silicon regions 1s in the region of the small-sized element isolation insulating films 2s (all oxidized in other regions).

It is not always necessary to provide the element isolation insulating films on the channels. Accordingly, for example, after the formation of the element isolation insulating films, a resist which covers the channel sections may be formed by lithography to form diffusion layers 3a, 3b.

The remaining steps are the same as in the corresponding ones carried out in the embodiment 1, so that description there of will be omitted.

The operation of this DRAM will now be described.

FIG. 12 illustrates a main portion of a memory cell array in which four word lines and two pairs of bit lines are shown.

Referring to FIG. 12, reference numerals I11–I42 denote memory cells each comprising a switching element S and a capacitor C. The switching element S is, for example, a 2-terminal element having a voltage-current characteristic which has a predetermined bidirectional potential barrier $V_p$ as shown FIG. 3 in the embodiment 1. The switching element S is realized by a structure in which a p-type layer is inserted between two n-type layers as shown in FIG. 9. The potential barrier $V_p$ is determined by its punch-through breakdown voltage or breakdown voltage depending on the respective impurity concentrations of the layers. Character C denotes a capacitor which is connected with the switching element S in series with the intermediate node N being used as a data storing terminal. The capacitor side terminals of the memory cells are connected in common in the row direction to form the word lines (WL), and the switching element side terminals are connected in common in the column direction to form bit lines (BL). Here, folded bit line type used in an ordinary DRAMs is employed as the structure of the bit line.

A sense amplifier 102, a bit line precharge circuit 103, a dummy cell 104 and a column selection switching circuit 105 are provided to each pair of bit lines (BL, $\overline{BL}$).

The operation of this embodiment will be described with reference to FIGS. 13–16. FIG. 13 shows reading and rewriting of data "0" written into a memory cell. In this fold bit line type structure, all the bit line pairs (BL, $\overline{BL}$) in a standby state are precharged to a potential $V_{BL}$ by the bit line precharge circuit 103. All the word lines (WL) and dummy word lines (DWL) are also set to $V_{BL}$. The potential at the data storing node of the memory cell at this time is substantially equal to $V_{BLL}$ or $V_{BLH}$ corresponding to data "0" or "1", respectively. $V_{BLL}$ and $V_{BLH}$ are, for example, the bit line precharge potential $V_{BL}$ plus half of the potential barrier $V_p$ of the switching element of the memory cell, and the bit line precharge potential $V_{BL}$ minus half of the potential barrier $V_p$ of the switching element of the memory cell, respectively. Namely, $V_{BLL}=V_{BL}-V_p/2$ $V_{BLH}=V_{BL}+V_p/2$ By setting the potential as described above, no voltage exceeding the potential barrier of the switching element of a non-selected memory cell is applied to the switching element of the non-selected memory cell. Accordingly, the data stored in the non-selected memory cell is not destroyed even if the bit line potential may change to $V_{BLL}$ or $V_{BLH}$ during the reading operation of other memory cells.

A reference level $V_{DC}$ is written beforehand through a transistor Q10 into the storing node (DN) of the dummy cell 4. The $V_{DC}$ is, for example, $V_{BL}$.

The reading and rewriting of the stored data will be described. In FIG. 13, when the reading operation starts, EQL is lowered (41) so as to make the bit line in floating state.

Then, a word line subsequently selected and the corresponding dummy word line are raised (42, 43). In FIG. 13, DWL is raised when either WL1 or WL3 is selected while DWL is raised when WL2 or WL4 is selected. By raising the word line, the potential of the storing node (N) of memory cells for one line connected to that word line is also raised due to the capacitance coupling (44). When the word line and the dummy word line are raised to the level of $V_{BL}+V_p$ or higher, the potential of the storing node (DN) of the dummy cell becomes $V_{BL}+V_p$ or higher. Thus, a voltage higher than the potential barrier is applied to the switching element. This causes electric charges to flow into the bit line (BL) from the DN, and hence its potential rises (45).

The switching element of the memory cell where "0" is written and having an initial potential of $V_{BLL}=V_{BL}-V_p/2$ cannot be turned on until the word line potential increases to $V_{BL}+3/2V_p$. Accordingly, the bit line (BL) potential is maintained at $V_{BL}$ (46). The raised potential ($V_{WLH}$) of the word line in this reading operation may be $V_{BL}+3/2\ V_p$, for example, in an ideal case where the storing node N of the memory cell has no capacitance except for the capacitance caused by that word line. If the node N has parasitic capacitance for elements other than that word line, the raised potential $V_{WLH}$ of that word line may be increased to $V_{BL}+3/2V_p$ or higher. $V_{WLH}$ may be a potential high enough to change the potential of the bit line from which "0" is to be read.

The voltage difference produced between the bit line pair is then amplified by a sense amplifier 102. The sense amplifier 102 may be a flip-flop sense amplifier comprising NMOS transistors (Q1, Q2) and PMOS transistors (Q3, Q4). The respective common source nodes SAN and SAP are lowered and raised to $V_{BL}$ and $v_{BLH}$, respectively (47). By this sense operation, the potentials of the bit lines BL, BL are changed to $V_{BLL}$, and $V_{BLH}$, respectively. At this time, the potential of the storing node of the memory cell is lowered along with the potential of BL such that the potential difference between the storing node potential of the memory cell and the $V_{BL}$ of the BL becomes $V_p$ (48). When the potentials at the BL and the BL are stabilized, the word line potential is lowered to start a rewriting operation (49). By lowering the word line potential, the potential of the storing node (N) of the memory cell is also lowered due to coupling. For example, when the word line potential $V_{WLL}$ is lowered to $V_{BL}-V_p$, the storing node N is going to be temporarily lowered to $V_{BL}-2\ V_p$. However, because the switching element is turned on (50), the potential of the storing node N is clamped to a potential which is lower than the bit line potential $V_{BLL}=V_{BL}-V_p/2$ by $V_p$ at that time or to $V_{BL}-3/2\ V_p$. Thereafter, when the word line is raised to the potential of $V_{BL}$ (51), the storing node potential is returned to $V_{BLL}=V_{BL}-V_p/2$ which is the same as the initial potential (52) to thereby terminate the rewriting operation. Finally, the bit line pair (BL, BL) is precharged to $V_{BL}$ (53) to thereby terminate the series of operations.

FIG. 14 shows the reading and rewriting operations of a cell in which data "1" is written. The operations of the word line, dummy word line and sense amplifier are similar to the case where "0" is read out. However, if "1" is to be readout, a change in the bit line (BL) potential due to a rise of the word line potential is large compared to the dummy cell side (BL) because the initial potential of the storing node N of the memory cell is high ($V_{BLH}=V_{BL}+V_p/2$). Therefore, conversely, the BL side is amplified toward high potential while BL toward the low side when "0" is read out by the operation of the sense amplifier. Thereafter, by lowering the WL, the storing node is also clamped to the bit line potential ($V_{BLH}$)-$V_p$ or $V_{BL}-V_p/2$. By returning WL to $V_{BL}$ potential, the storing node potential is returned to $V_{BL}+V_p/2$ which is the same as the initial potential.

Outputting the read data to an external circuit is performed by raising the CSL of the column selected after the operation of the sense amplifier and by transferring the bit line potential difference to an I/O line.

The writing operation is performed by sensing a bit line and forcibly reversing the bit line potential through the I/O line, as shown in FIGS. 15 and 16 in which FIG. 15 shows the writing of "0" while FIG. 16 shows the writing of "1".

After the bit line potential is reversed, the word line potential is temporarily lowered to $V_{WLL}$ and then returned to $V_{BL}$ as in the rewriting operation included in the reading operation to thereby write $V_{BLL}$ ("0") or $V_{BLH}$ ("1") into the storing node of the memory cell.

As described above, in the embodiment of this invention, the operation of a control circuit for the word line and sense amplifier may be the same at all times irrespective of reading and writing.

FIG. 17 shows another example of a dummy cell. In this example, the dummy cell comprises only a switching element and a capacitor as in the memory cell and has no writing transistor unlike the embodiment of FIG. 12.

FIG. 18 shows the operation of the dummy cell of this example. In FIG. 18, in addition to the operation of the dummy word line, the operative waveforms of the dummy cell node DN and the reference bit line (BL) when the read data of the memory cell is "0" and "1" are shown together. DN is at $V_{VL}$ in the precharged state and changes as shown, as in the embodiment of FIG. 12, until DWL is raised and the bit line is sensed. In this example, the potential of DWL is maintained at $V_{WLL}$ until the reading (writing) cycle is terminated and the potential of the bit line pair again comes to $V_{BL}$ (91).

Thereafter, DWL is temporarily raised to $VD=V_{BL}+V_p$ (92), and then returned to $V_{BL}$. By this operation, a potential $V_{BL}$ is written into the storing node DN of the dummy cell through the switching element from the bit line. In this embodiment, the dummy cell requires no special write transistors, so that a device having exactly the same structure as the memory cell can be used. Thus, the structure of the device is simplified.

FIG. 19 shows another embodiment in which the operation of the word line is modified. In this embodiment, the potential of the WL is temporarily raised to $V_{WLH}$ by the reading operation to transfer electric charges to the bit line. Then, the potential of the WL is lowered to and maintained at $V_{WL}=V_{BL}+V_p$. Thereafter, a bit line is sensed and an operation is performed in the same manner as in the embodiment of FIG. 12. In the present embodiment, a long-time application of high voltage to the memory cell capacitor can be avoided when "0" is to be read out compared to the embodiment of FIG. 12. That is, in FIG. 13, after the bit line is sensed, a voltage of $V_{VLH}-V_{BLH}=V_p$ is applied across the word line and the storing node of the memory cell while in FIG. 19 only $V_{WL}-V_{BLH}=V_p/2$ is applied. This is effective because the capacity of the memory sell capacitor is increased and hence the reliability of the memory cell is not deteriorated even if the thickness of the oxide film of the capacitor is reduced.

FIG. 20 shows another embodiment in which the connecting relationship between the memory cell, word line and bit line is reversed compared to the above embodiments. In this embodiment, contrary to the embodiment of FIG. 12, the switching element side is connected to the word line and the capacitor is connected to the bit line 12. In this connection, the operation of the word line and the sense amplifier is the same as in the embodiment of FIG. 12.

FIGS. 21 and 22 show the reading operations of "0" and "1", respectively. The relationship between the read data and the potential of the bit line is such that when "0" is to be read out, BL is high while when "1" is to be read out, BL is low, which is reverse to the potential relationship in the above embodiment.

Embodiment 4

FIGS. 23(a), (b) and (c) illustrate a memory cell array of a cross point type SOI structure as a fourth embodiment of the present invention.

As shown in FIGS. 23(a), (b) and (c), a memory cell of the embodiment 2 is modified to the SOI structure. Element isolation insulating films 2 are formed in grooves extending in row and column directions so as to arrive at an insulating film 30 embedded in the surface of the p-type silicon substrate. The insulating films 2 and the embedded insulating films 30 form a capacitor and a switching element on the p-type silicon column 10 which is isolated from each other.

In this structure, no diffusion layers are formed because the silicon columns are insulated from the substrate, and the p-type silicon columns 10 are adjusted so as to have a desired concentration.

Other structural potions are constructed in the same manner as in the embodiment 2.

In this embodiment, a capacitor comprises a silicon column 10 (first electrode), a capacitor insulating film 4 of a 2-layered structure including a silicon nitride film and a silicon oxide film covering the side walls of the silicon column 10, and a capacitor electrode 5 as a second electrode made of a polycrystalline silicon film formed in the groove so as to cover the outside of the insulating film 4. Each capacitor electrode 5 extends over a plurality of memory cells arranged in one direction so as to become a word line (WL). The surface of the substrate on which the word lines are formed is covered with a first inter-layer insulating film 6 with contact holes 7 for forming switching elements.

The switching element S comprises as a potential barrier layer a p-doped single crystalline silicon layer 9 selectively grown from the silicon column 10 exposed in the associated contact hole 7. On the potential barrier layer, an n-type polycide layer (two-layered structure of an n-type polycrystalline silicon layer and a tungsten silicide layer) serving as a third electrode and a bit line 8 is formed. The switching element S uses a punch-through breakdown voltage or a junction break-down voltage between an n-type diffusion surface (not shown) formed by diffusing impurities from the n-type polycide layer into the p-type single crystalline silicon layer 9 and the n-type silicon column 10 as a first electrode. The bit line 8 is formed on the inter-layer insulating film 6 and extends such as to connect the single crystalline silicon layers 9 formed in the contact holes 17 of the memory cells that are disposed in the direction in intersection with the word lines to each other.

This embodiment uses as the potential barrier layer of the switching element the punch-through breakdown voltage or junction breakdown voltage of single crystalline silicon layer 9 formed on the silicon column 10. Since the switching element has only two terminals, it is possible to make the devices small to a great extent.

According to this embodiment, since no junction (parasitic) capacitance exists with the substrate, a signal from the capacitor is reliably transmitted and therefore the stabilized operation of the memory cells can be achieved in addition to the advantages produced by embodiment 2.

Embodiment 5

A fifth embodiment will now be described by referring to FIGS. 24(a), (b) and (c).

In the embodiment 4, npn junctions are formed in the contact holes by selective growth process. In contrast, in the embodiment 5, an n-type diffusion layer 3 is formed before the formation of the silicon columns and a p-type layer 31 is formed by implanting p-type impurities such as boron by high acceleration ion implantation process as shown in FIG. 24(b). In order to improve the contact characteristic, diffusion layers 32 are formed in the surfaces of the n-type diffusion layers 3. Alternatively, phosphorus, boron and phosphorus may be ion implanted sequentially to form n-p-n layers by high acceleration ion implantation after the formation of n-type diffusion layers 3. At this time, it is important that the impurity concentration profile in the direction of depth is symmetrical with respect to the p-type layer. With this arrangement, $V_p$ can have the same values on the plus and minus sides.

In this embodiment, a high concentration p-type substrate 1 is used as the substrate.

Other portions are the same as in the embodiments 2 and 4.

In this embodiment, a SOI structure may be employed.

Embodiment 6

A sixth embodiment of this invention will now be described by referring to FIGS. 25(a), (b) and (c).

This embodiment is characterized by the use of FN tunneling through a thin insulating film as a switching element.

Figure 25B:
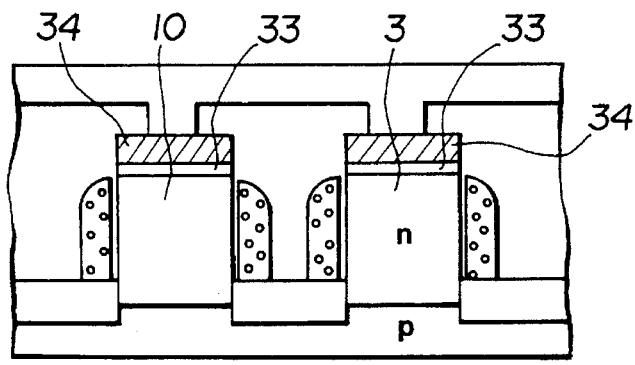
Figure 25C:
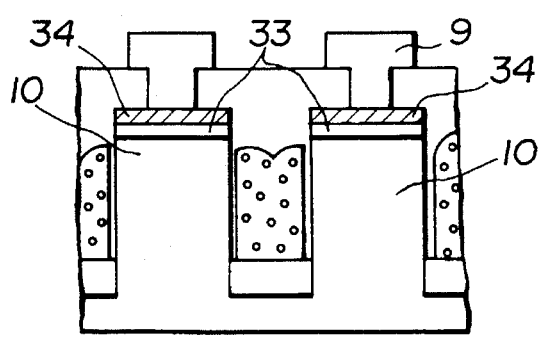

Referring to FIG. 25(b), an n-type polycrystalline silicon layer 34 is formed through a thin silicon oxide film 33 on an n-type silicon column 10 to perform switching operations using to FN tunneling.

Other portions are the same as in the embodiment 5.

In manufacturing, the silicon oxide films 33 and the n-type polycrystalline silicon layers 34 may be formed before the formation of the silicon columns 10. Alternatively, after the formation of the portions up to the word lines, $n^+$ grown layers, thin silicon oxide films 33 and n-type polycrystalline silicon layers 34 may be formed on the top of the silicon columns exposed in the associated contacts.

While in this structure a high concentration p-type substrate 1 is used, a SOI structure may also be used. This embodiment may be carried out similarly by exchanging p-type and n-type with each other.

The potential barrier in this embodiment is not limited to that described above and is applicable to any of 2-terminal potential barriers.

As described above, according to the present invention, a memory based on new operative principles is realized which switches a capacitor as a storing node by a 2-terminal element. Since the number of terminals is reduce, more dense integration is achieved.

What is claimed is:

1. A semiconductor memory device comprising:

a plurality of memory cells disposed in a matrix arrangement, each memory cell including a capacitor and a switching element having a potential barrier and connected in series with the capacitor;

a plurality of word lines each connected to a first electrode of each of said plurality of memory cells in a direction of the matrix arrangement of the memory cells;

a plurality of bit lines each connected to a second electrode of said each of said plurality of memory cells in a direction in intersection with the word lines; and control means for controlling an electrical potential of one of the plurality of word lines such that the potential is raised from a first potential to a second potential to provide one bit line of the plurality of bit lines in a floating state with a potential change corresponding to a voltage across the capacitor of an associated memory cell and a potential difference between the one bit line and a reference bit line is detected and amplified, and then the potential of the one word line is lowered to a third potential to perform a rewriting operation and thereafter returned to the first potential.

2. A semiconductor memory device according to claim 1, wherein the first potential is equal to a precharged potential of the bit line.

3. A semiconductor memory device according to claim 1, wherein the second potential is equal to a precharged potential of the one bit line plus at least 3/2 of the potential barrier of the switching element.

4. A semiconductor memory device according to claim 1, wherein the third potential is equal to a precharged potential of the bit line minus the potential barrier.

5. A semiconductor memory device according to claim 1, wherein the control means forcibly reverses the potential of the bit line before the potential of the word line is lowered to the third potential to thereby write a reverse data.

6. A semiconductor memory device according to claim 1, wherein said control means initially precharges said one bit line and said reference bit line to a precharge voltage, and said potential difference between said one bit line and said reference bit line is detected by raising a potential of one of said one bit line and said reference bit line from said precharge voltage to a first level equal to said precharge voltage plus half the potential barrier of said switching element, and lowering a potential of the other of said one bit line and said reference bit line from said precharge voltage to a second level equal to said precharge voltage minus half the potential barrier of said switching element.

7. A semiconductor memory device according to claim 1, wherein said switching element included in said each memory cell includes a first conductive layer sandwiched between two second conductive layers, and said potential barrier of the switching element is determined by one of a punch-through voltage between said two second conductive layers and a breakdown voltage of a junction including the first conductive layer and the second conductive layer.

8. A semiconductor memory device according to claim 1, wherein said switching element included in said each memory cell includes an insulating film interposed between two terminals of said capacitor included in said each memory cell and said potential barrier of said switching element is determined by a Fowler Nordheim tunneling voltage.

9. A semiconductor memory device comprising:

a plurality of memory cells disposed in a matrix arrangement, each memory cell including a capacitor and a switching element having a potential barrier and connected in series with the capacitor;

a plurality of word lines each connected to a first electrode of each of said plurality of memory cells in a direction of the matrix arrangement of the memory cells;

a plurality of bit lines each connected to a second electrode of said each of said plurality of memory cells in a direction in intersection with the word lines; and control means for controlling an electrical potential of one word line of the plurality of word lines such that the potential is raised from a first potential to a second potential to provide one bit line of the plurality of bit lines in a floating state with a potential change corresponding to a voltage across the capacitor of an associated memory cell and a potential difference between the one bit line and a reference it line is detected and amplified, and then the potential of the one word line is lowered to a third potential to perform a rewriting operation and thereafter returned to the first potential, wherein the first potential is equal to a precharged potential of the bit line, the second potential is equal to the precharged potential of the bit line plus at least 3/2 the potential barrier of the switching element and the third potential is equal to the precharged potential of the one bit line minus the potential barrier.

* * * * *